United States Patent
Nestler

(10) Patent No.: US 6,278,392 B1
(45) Date of Patent: Aug. 21, 2001

(54) GAIN ADJUSTABLE SIGMA DELTA MODULATOR SYSTEM

(75) Inventor: Eric Nestler, Harvard, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/371,114

(22) Filed: Aug. 10, 1999

(51) Int. Cl.$^7$ ...................................................... H03M 3/00
(52) U.S. Cl. .......................................... 341/143; 341/155
(58) Field of Search .................................... 341/143, 153

(56) References Cited

U.S. PATENT DOCUMENTS

| | | | |
|---|---|---|---|
| 4,851,841 | 7/1989 | Sooch | 341/143 |
| 5,134,401 | * 7/1992 | McCartney et al. | 341/143 |
| 5,862,069 | 1/1999 | Nestler | 364/754.01 |
| 5,995,036 | * 11/1999 | Nise et al. | 341/172 |
| 6,061,008 | * 5/2000 | Abbey | 341/143 |
| 6,081,565 | * 6/2000 | Marandi et al. | 375/435 |
| 6,154,161 | * 11/2000 | Leme et al. | 341/143 |

OTHER PUBLICATIONS

"A Power Meeting ASIC With a Sigma–Delta–Based Multiplying ADC" by F.Op't Eynde; 1994 IEEE International Solid–State Circuits Conference; pp. 186 & 187.

* cited by examiner

*Primary Examiner*—Peguy JeanPierre
(74) *Attorney, Agent, or Firm*—Samuels, Gauthier & Stevens, LLP

(57) ABSTRACT

A system having an adjustable gain includes: a modulator, for producing a stream of digital words representative of an input analog signal; and, a gain adjustor, fed by a gain signal representative of the adjustable gain, for converting the stream of digital words produced by modulator into an output stream of bits representative of the gain adjusted input analog signal. The stream of stream of digital words produced by modulator, which represent the gain adjusted input analog signal, can be produced with an register for storing the gain signal and an adder. Further, the stream of digital words bits produced by modulator can fed to an compact sinc filter for conversion into digital words which represent digital samples on the gain adjusted input analog signal. The system includes a sigma-delta modulator for producing a stream of digital words having values, M or N, such stream of digital words bits being representative of an input analog signal, $X(t)$ fed to the modulator. A gain adjustor is fed by the sigma-delta modulator and a gain signal representative of the variable gain. The gain adjustor converts the stream of digital words produced by sigma delta modulator into an output stream of digital words having values P or Q, where $P=M-(G-1)/2$ and $Q=N+(G-1)/2$, such output stream of digital words representing an output analog signal $Z(t)=GX(t)$.

8 Claims, 3 Drawing Sheets

US 6,278,392 B1

GAIN ADJUSTABLE SIGMA DELTA MODULATOR SYSTEM

BACKGROUND OF THE INVENTION

This invention relates generally to gain adjustable systems and more particularly to gain adjustable sigma delta modulator systems.

As is known in art, gain adjustable systems have a wide range of application. One such application is as in a multiplying circuit, such as in power measuring. Many such systems use digital circuitry in such application. One application is for use in watt-hour meters. One example of a watt-hour meter that multiplies two one-bit digital data streams is disclosed in European Patent Application 90313050 to The General Electric Company. One of the two one-bit digital data streams is representative of the current supplied to a load and the other of the two one-bit digital data streams is representative of the voltage across the load. In the disclosed watt-hour meter, an accumulator is used to accomplish the multiplication of the two data streams and to generate an output signal having a pulse rate that is representative of the power supplied to the load.

Another example of a power meter that multiplies two time varying signals is disclosed in an article entitled "A Power Meter ASIC With a Sigma-Delta-Based Multiplying ADC" by F. Op 't Eynde, published in the ISSCC94 Proceedings, paper TP 11.1. In the system disclosed by Eynde, a one-bit data stream from a sigma delta modulator is multiplied in the analog domain with a second input time varying signal. The resulting product is digitized using a second sigma-delta modulator. Since the multiplication in the Eynde system is accomplished in the analog domain, the system suffers from the same drawbacks as the analog multipliers discussed above.

SUMMARY OF THE INVENTION

In accordance with one feature of the invention, a system is provided having an adjustable gain. The system includes: a modulator for producing a stream of digital words representative of an input analog signal; and, a gain adjustor fed by a gain signal representative of the adjustable gain for converting the stream of digital words produced by modulator into an output stream of digital words representative of the gain adjusted input analog signal.

With such an arrangement, the stream of digital words produced by modulator, which represent the gain adjusted input analog signal, can be produced with a register for storing the gain signal and an adder. Further, the stream of digital words produced by modulator can be fed to an compact sinc filter for conversion into digital words which represent digital samples of the gain adjusted input analog signal.

In accordance with another feature of the invention, a system is provided having a sigma-delta modulator for producing a stream of digital words having values, M or N, such stream of digital words being representative of an input analog signal, X(t) fed to the modulator. A gain adjustor is fed by the sigma-delta modulator and a gain signal representative of the variable gain. The gain adjustor converts the stream of digital words produced by sigma delta modulator into an output stream of digital words having values P or Q, where $P=M-(G-1)/2$ and $Q=N+(G-1)/2$, such output stream of digital words representing an output analog signal $Z(t)=GX(t)$.

In accordance with another feature of the invention, a multiplying circuit is provided. The multiplying circuit includes a first analog to digital converter fed by a first analog signal, for converting such first analog signal into a corresponding, gain adjusted, digital signal. The first analog to digital converter includes: a sigma-delta modulator for converting such first analog signal into a series of digital words; a gain adjustor, fed by a signal representative of an adjustable gain, for converting such series of digital words into a gain adjusted series of digital words; and a filtering section for converting the gain adjusted series of digital words into a corresponding output of digital words, each one of the output digital words representing a gain adjusted sample of the first analog signal. A second analog to digital converter is provided for converting a second analog signal into a corresponding digital signal. A multiplier multiplies the output digital words produced by the filtering section with the digital signal produced by the second analog to digital converter.

In accordance with one embodiment of the multiplying circuit, the second analog to digital converter converts the second analog signal into a corresponding stream of digital words.

In accordance with another feature of the multiplying circuit, the stream of digital words produced by the second analog to digital converter is multiplied by the output digital words produced by the filtering section in the multiplier.

In accordance with another feature of the invention, the filtering section has a sync filter.

In accordance with another feature of the invention, the multiplying circuit includes a second subtractor for subtracting the mean of the values representing the stream of digital words produced by the sigma delta modulator from the output digital words produced by the filtering section.

In accordance with another aspect of the invention, a method is provided for adjusting gain provided to an input analog signal. The method includes: producing a stream of digital words representative of the input analog signal; and converting the stream of digital words into an output stream of digital words representative of a gain adjustable input analog signal.

In accordance with one embodiment of the invention, the method including producing the digital words in the output stream of bits with the same mean as the digital words in the stream of digital words representative produced by the sigma delta modulator.

BRIEF DESCRIPTION OF THE DRAWING

These and other features of the invention will become more readily apparent from the following detailed description when read together with the accompanying drawings, in which.

DESCRIPTION OF THE PREFERRED EMBODIMENTS

Figure 1:
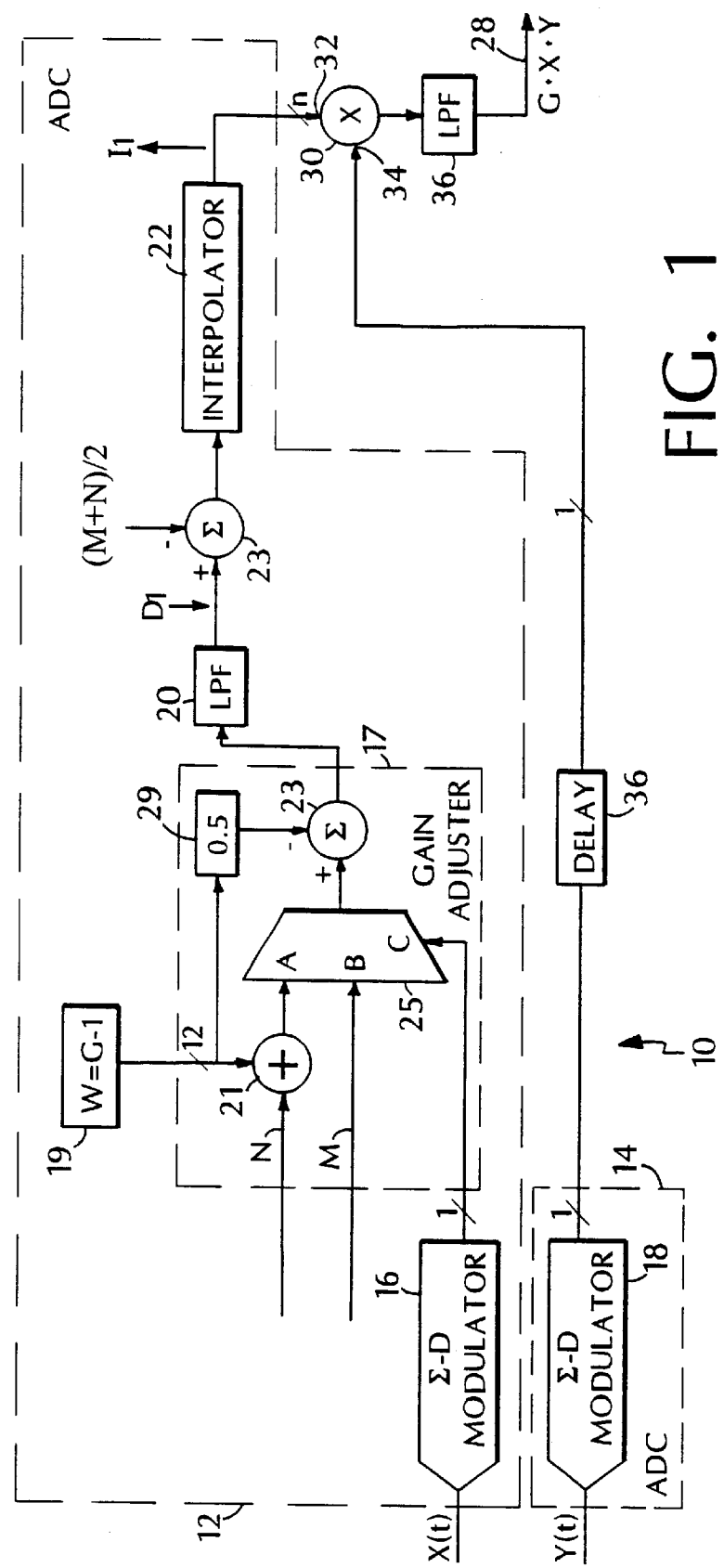
FIG. 1 is a block diagram of a multiplier according to the invention.

Referring now to the FIG. 1, a block diagram of a multiplier 10 is shown fed by a pair of input analog signals X(t) and Y(t) for producing an output digital signal, Z, representative of GX(t)Y(t), where G is an adjustable gain and t is time. More particularly, the multiplier 10 operates by providing at an output 28 an n-bit signal, Z, representative of the gain adjusted instantaneous product of input analog signals X(t) and Y(t).

More particularly, the multiplier 10 includes a pair of analog to digital converters 12, 14 fed by the input analog signals X(t) and Y(t), respectively. The analog to digital converters 12, 14 include first and second modulators 16 and 18 fed by the input analog signal X(t) and Y(t), respectively. Each of the first and second modulators 16 and 18 is an oversampling sigma-delta modulator (sometimes referred to as a "delta-sigma modulator") that provides a stream of digital words, here in this example, each one of the digital words in the stream thereof is a one-bit digital word. The digital words are provided by the modulator 16 at a predetermined data rate. In a preferred embodiment of the present invention, each of the sigma-delta modulators 16 and 18 can be, for example, implemented using a programmable sigma-delta modulator as disclosed in U.S. Pat. No. 5,134,401 to McCartney. The one-bit output data stream of each of the first and second modulators 16 and 18 is a serial stream of digital words, here each word being one bit, having a logical value of "M" or "N"; here M=0 and N=1. The data rate (i.e., digital word or bit rate) of each serial stream of bits is equal to the sample rate of the modulator from which the serial stream is generated. The ratio of the number of bits of the data stream having a value of "N" to the number of bits having a value of "M" over a given time period at the output of each of the first and second modulators 16 and 18 provides an indication of the magnitude of the analog signals X(t) and Y(t), respectively. Thus, each one of the modulator 16, 18 thus produces a stream of bits representative of an input analog signals X(t) and Y(t) fed thereto, respectively.

The output of the sigma delta modulator 16 is fed to a gain adjuster 17. The gain adjuster 17 is fed by a gain signal W=1−G representative of the adjustable gain, G, for converting the stream of bits produced by modulator 16 in an output stream of bits representative of the gain adjusted input analog signal, i.e., GX. More particularly, the gain adjuster 17 is fed by the sigma-delta modulator 16 and a gain signal W=G−1, stored in register 19, representative of the variable gain, C. Here, the signal W is a 12 bit digital word. The gain adjuster 17 converts the stream of bits produced by sigma delta modulator 16 into an output stream of bits having values P or Q, where P=M−(G−1)/2 and Q=N+(G−1)/2. The output stream of bits produced by the gain adjuster 17 represents an output analog signal Z(t)=GX(t). The gain, G, may be adjusted by changing the value W stored in register 19.

More particularly, the adjuster 17 includes an adder circuit 21, a selector (or multiplexer) 25 and a subtractor 23 arranged as shown. The stream of bits produced by the modulator 16 is fed to the control terminal, C, of the selector 25. One input to the selector 25 (i.e., input A) is fed by the output of adder 21 which algebraically adds the value W=(1−G) stored in register 19 to the value N. The other input to the selector 25 (i.e., input B) is fed by a value representative of M. The output of the register 19 (i.e., W=1−G) is fed to the subtractor 23 via a 0.5 multiplier 29, here a sign-extending shift right network, along with the output of the selector 25. When the value of the bit in the stream of bits produced by the modulator 16 is M, the B input to the selector 25 (i.e., the value M) is fed to the subtractor 23 where it has subtracted from it 0.5W=0.5(G−1) to provide a value M−(G−1)/2 at the output of the subtractor 23. On the other hand, when the value of the bit in the stream of bits produced by the modulator 16 is N, the A input to the selector 25 (i.e., the value N+(G−1)) is fed to the subtractor 23 where it has subtracted from it 0.5W=0.5(G−1) to provide a value N+(G−1)/2 at the output of the subtractor 23. Thus, the adjustor 17 algebraically adds (G−1) to the value N in the stream of bits produced by the sigma-delta modulator 16 to produce a value N+(G−1) when the bit in the stream thereof has a value M and the subtractor 23 subtracts 0.5 (G−1) from the values N+(G−1) and from the value M when the bit in the stream thereof has a value N to thereby produce the output stream of bits. It is noted therefore that the bits of the stream of bits produced at the output of the modulator 16 and represented by values M, N are, because of the gain adjuster 17, now represented by values M−(G−1)/2 and N+(G−1)/2, respectively. Thus, in this example, where the bits produced by the modulator 16 are representative of values M=0 and N=1, the bits in the stream of bits produced by the gain adjuster 17 are represented by the values (1−G)/2 and (1+G)/2, respectively. For example, for a gain, G=0.75, the stream of bits produced at the output of the gain adjuster 17 would represent values 0.125 and 0.875, respectively. It is noted that the mean of the two values used to represent both the stream of bits produced by the modulator 16 and the stream of bits used to represent the stream of bits produced by the gain adjustor 17 is the same, i.e., (M+N)/2.

The output of the gain adjuster 17 is fed to a low-pass filter 20 which provides low-pass digital filtering and decimation of the one-bit output data stream of the first modulator 16. The low-pass filter 20 filters out high frequency noise produced by the modulator 16. The low-pass filter 20 also acts as a decimator and converts the one-bit output data stream at the input of the low-pass filter 20 to an n-bit data stream, where n is an integer greater than 1, and in a preferred embodiment of the present invention, n is equal to 16. The n-bit data stream output from the low-pass filter 20 has a data rate equal to the sample rate of the modulator 16 reduced by a decimation factor (D1) of the first low-pass filter. Here, the low pass filter 20 is sinc filter.

The output of the low pass filter 20 is fed to a subtractor 23 which removes the mean from the values P or Q. Thus, the subtractor is fed by a value (M+N)/2; here, in this example, 0.5. The output of subtractor 23 is fed to interpolator 22. Thus, the interpolator 22 receives the n-bit data stream and performs an up sampling of the n-bit data stream by a factor equal to I1.

The output of the interpolator 22 is fed to one input, (i.e., input 32) of multiplier 30. The other input to the multiplier 30 is fed by the stream of bits produced by the modulator 18 to the second input 34 of multiplier 30 after passing through a delay 36 equal to the delay between the output of modulator 16 and the input 32 to the multiplier 30. In one example, the up sample factor I1 of the interpolator 22 may be equal to the decimation factor D1 of the low-pass filter 20, and the sample rate of the modulator 16 equal to the sample rate of the modulator 18 and equal to 1 megahertz. In such example, the n-bit signal output from the interpolator 22 is at the same data rate as the one-bit signal output from the modulator 18. In a preferred embodiment, the output of the interpolator 22 is a 16-bit signal that is encoded using 2's complement numeric coding.

Alternatively, the sample rate of the first modulator 16 may not equal to the sample rate of the second modulator 18. In such example, the ratio (D1/I1) of the decimation factor (D1) of the low-pass filter 20 to the up sample factor (I1) of the interpolator 22 can be selected such that the n-bit output data stream of the interpolator 22 and the one-bit output data stream of the second modulator 18 are at the same data rate. In this example, the ability to sample the input signals X(t) and Y(t) at different sample rates provides additional flexibility in multiplying dissimilar signals.

In yet another example, the data rate of the n-bit output signal from the interpolator 22 may not be the same as the data rate of the one-bit data stream output from the modulator 18, rather, the data rate of the n-bit signal is lower than the data rate of the one-bit data stream output from the modulator 18. In this example, the multiplier 30 acts as an interpolator and up samples the n-bit data stream output from the interpolator 22, such that the data rate of the up sampled signal is equal to the data rate of the one-bit data stream output from the modulator 18. The operation of the multiplier 30 to perform this interpolation is described in greater detail in my U.S. Pat. No. 5,862,069 issued Jan. 19, 1999, entitled "Four Quadrant Multiplying Apparatus and Method" issued Jan. 19, 1999, assigned to the same assignee as the present application, the entire subject matter thereof being incorporated herein by reference.

In any event, the multiplier 30 has the input 32 coupled to the output of the interpolator 22, and the other input 34 coupled to the output of the modulator 18. The output of the subtractor is fed to a low-pass filter 36 which produces, at output 28, a digital signal representative of GXY. The multiplier 30 is shown in greater my above-referenced U.S. Patent.

Figure 2:
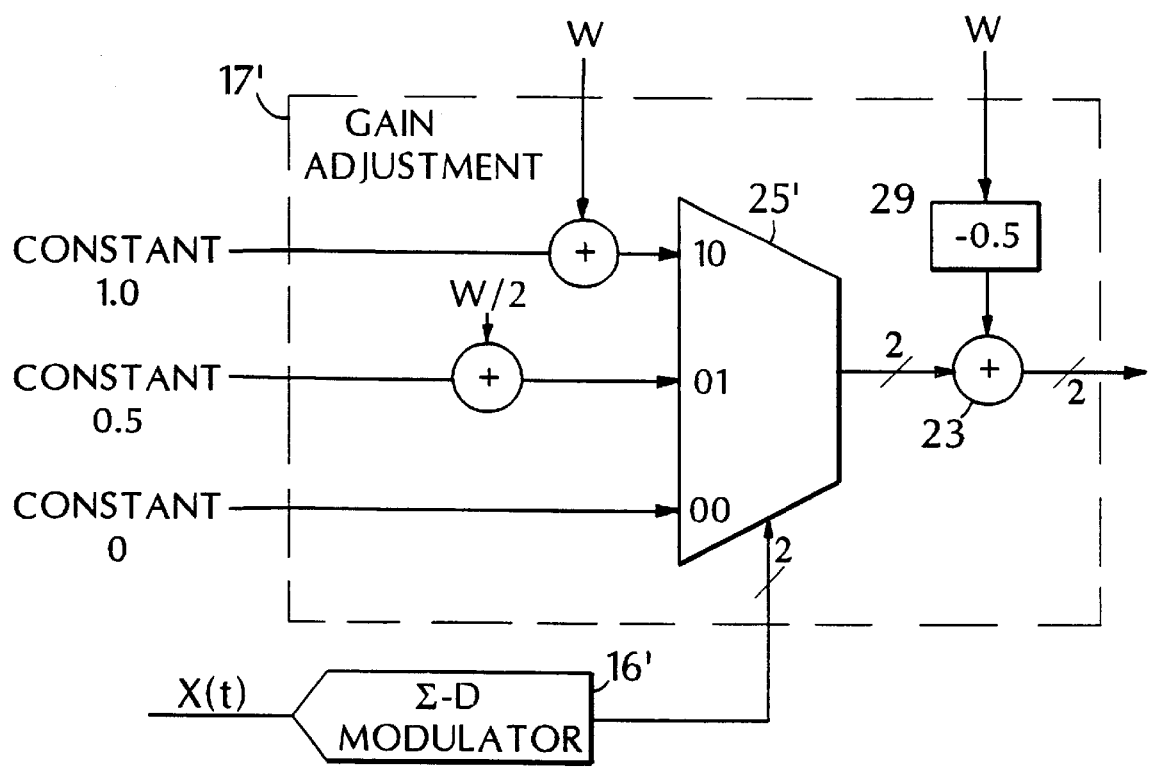
FIG. 2 is an alternative embodiment of a gain adjuster adapted for use in the multiplier of FIG. 1.

Referring now to FIG. 2, a gain adjuster 17' is shown here being fed by a sigma-delta modulator 16' which again produces a stream of digital words, here, however, each digital word is a two bit digital word rather than the one bit digital word produced by modulator 16 (FIG. 1). The digital words produced by modulator 16' are fed to the control terminal of a selector 25', as indicated. Here, unlike selector 25 (FIG. 1), the selector 25' has more than two inputs since each valid modulator output state must be adjusted. Here, while the output stream of digital words produced by modulator 25' is two bits, a three-state format is used even though a four-state format is possible. More particularly, with the three-state format, the output of the modulator 25' is interpreted as a $\{0, 0.5, 1\}$ set of values. This odd number of states is used rather than an even number (i.e., a four state set) in order to prevent values being in the set which cannot be represented by a finite number of bits. For example, if all four possible states were used in the four-state set, the output would be interpreted as $\{0, 0.3333 \ldots, 0.6666 \ldots, 0\}$. There may be cases were using an even number-state set might be useful; but, here, in this example, only odd length state sets will be use for the definition of the valid modulator 16' output states.

Thus, referring to FIG. 2, if the modulator 16' digital word is 00, a constant 0 is coupled to the output of the selector 25'; if the modulator 16' digital word is 01, a constant, 0.5, is summed with W/2 (i.e., 0.5+W/2) is coupled to the output of the selector 25'; and, if the modulator 16' digital word is 10, a constant, 1.0, is summed with W (i.e., 1.0+W) is coupled to the output of the selector 25', where W=G+1. Here, again, as with gain adjuster 17 (FIG. 1) the output of the selector 15' is fed to a summer 23 for combining with −0.5W.

It is noted in FIG. 2 that the inputs to the selector 25' are now modified by a summing a value which is dependent of the gain adjustment. This value is reduced by powers of 2 for the inner bit state, 01. The first and last states, 00 and 10, respectively, are always 1 and 0, respectively.

Figure 3:
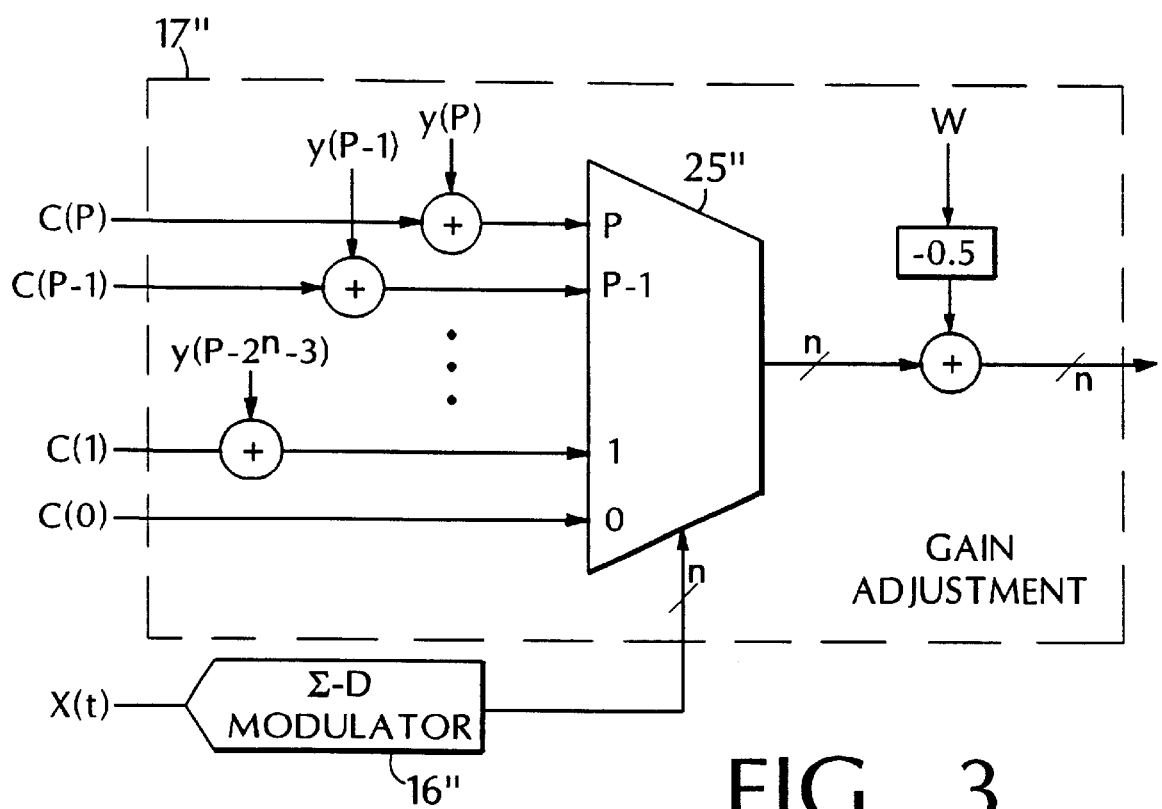
FIG. 3 is another alternative embodiment of a gain adjuster adapted for use in the multiplier of FIG. 1.

The technique described above can be extended to a general case where the modulator output fed to the gain adjuster has a length, n, where n is an integer. Thus, referring to FIG. 3. a gain adjuster 17" is fed by a sigma delta modulator 16" which produces a series of digital words, each word having n bits. The word has $2^n$ states, but here only an odd number of states will be used for reasons discussed above in connection with FIG. 2 (i.e., to simplify hardware implementation). The minimum modulator 16" digital word is 0 and the maximum digital word is $2^n-2$. Now, the selector 25" input constants can be defined for each of the modulator 16" output states as follows:

For s=set of modulator 16" output digital words, $\{0, 1, 2, \ldots, P\}$, where $P=2^n-2$; then, the selector 25" input constants are c(s)=set $\{1, 0.5, 0.25, \ldots 2^{-q}, 0\}$, where q=0, 1, \ldots, $2^n-3$.

The selector 25" constants are then modified by adding a value which is dependent on the gain adjustment, W, where W=G−1, and G is the total gain of the circuit. The adjustments to the selector 25" input constants, y(s), varies from 1.0 down to 0.0, and y(s)=W+c(s), where c(s) is defined above.

Other embodiments are within the spirit and scope of the appended claims

What is claimed is:

1. A system for having an adjustable gain, G, comprising:
a sigma-delta modulator for producing a stream of digital words having logic values, M or N, M representing a first binary logic state of a bit within the stream of digital words and N representing a second binary logic state of a bit within the stream of digital words, such stream of digital words being representative of an input analog signal, X(t), fed to said sigma-delta modulator;
a gain adjustor, fed by said sigma-delta modulator and a gain signal representative of the variable gain, for converting the stream of digital words produced by said sigma delta modulator into an output stream of digital words having values P or Q, where P=M−(G−1)/2 and Q=N+(G−1)/2, such output stream of digital words representing an output analog signal Z(t)=GX(t).

2. The system as recited in claim 1, wherein said gain adjustor includes an adder circuit for algebraically adding G−1 to a value of N to produce a value N+(G−1) when the digital words in the stream produced by said sigma-delta modulator has a value M and a subtractor for subtracting 0.5*(G−1) from the values N+(G−1) when the digital words in the stream produced by said sigma-delta modulator has a value M and for subtracting 0.5*(G−1) from a value of M when the digital word in the stream produced by said sigma-delta modulator has a value N to thereby produce the output stream of digital words.

3. A multiplying circuit, comprising:
(a) a first analog to digital converter fed by a first analog signal, for converting such signal into a corresponding, gain adjusted, digital signal, such first analog to digital converter, comprising:
(i) a sigma-delta modulator for converting such first analog signal into a series of digital words;
(ii) a gain adjustor, fed by a signal representative of an adjustable gain, for converting such series of digital words into a gain adjusted series of digital words; and
(iii) a filtering section for converting the gain adjusted series of digital words into corresponding output digital words, each one of the output digital words representing a gain adjusted sample of the first analog signal;
(b) a second analog to digital converter for converting a second analog signal into a corresponding digital signal; and (c) a multiplier for multiplying the output digital words produced by the filtering section with the digital signal produced by the second analog to digital converter.

4. The multiplying circuit recited in claim 3 wherein the second analog to digital converter converts the second analog signal into a corresponding stream of digital words.

5. The multiplying circuit recited in claim 4 wherein the stream of digital words produced by the second analog to digital converter are multiplied by the output digital words produced by the filtering section in the multiplier.

6. The multiplying circuit recited in claim 5 wherein the filtering section includes a sinc filter.

7. The multiplying circuit recited in claim 6 including a second subtractor for subtracting the mean of the value of the digital words in the stream of digital words produced by the modulator from the output digital words produced by the filtering section.

8. A method for adjusting gain provided to an input analog signal, comprising:

producing a stream of digital words representative of the input analog signal; and converting the stream of digital words in an output stream of digital words representative of a gain adjustable input analog signal wherein the digital words in the output stream of digital words have the same mean as the digital words in the stream of digital words representative of the input analog signal.

* * * * *